(12) United States Patent
Allman et al.

(10) Patent No.: US 7,582,566 B2
(45) Date of Patent: Sep. 1, 2009

(54) METHOD FOR REDIRECTING VOID DIFFUSION AWAY FROM VIAS IN AN INTEGRATED CIRCUIT DESIGN

(75) Inventors: Derryl D. J. Allman, Camas, WA (US); Hemanshu D. Bhatt, Vancouver, WA (US); Charles E. May, Fairview, OR (US); Peter Austin Burke, Portland, OR (US); Byung-Sung Kwak, Portland, OR (US); Sey-Shing Sun, Portland, OR (US); David T. Price, Gresham, OR (US); David Pritchard, Saxony (DE)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 12/018,849

(22) Filed: Jan. 24, 2008

(65) Prior Publication Data

US 2008/0132065 A1 Jun. 5, 2008

Related U.S. Application Data

(62) Division of application No. 11/323,400, filed on Dec. 29, 2005, now Pat. No. 7,361,965.

(51) Int. Cl.
*H01L 21/311* (2006.01)
(52) U.S. Cl. ............... 438/700; 438/598; 257/E21.304; 257/E21.532; 257/E21.585
(58) Field of Classification Search ............... 438/700, 438/692, 618, 687, 598
See application file for complete search history.

(56) References Cited

U.S. PATENT DOCUMENTS

| | | | | |
|---|---|---|---|---|
| 4,826,455 A | * | 5/1989 | Case et al. | 439/744 |
| 6,537,097 B1 | * | 3/2003 | Szu | 439/342 |
| 7,142,395 B2 | * | 11/2006 | Swanson et al. | 360/245.9 |
| 7,361,965 B2 | * | 4/2008 | Allman et al. | 257/491 |
| 7,436,040 B2 | * | 10/2008 | Allman et al. | 257/491 |

* cited by examiner

*Primary Examiner*—David Nhu
(74) *Attorney, Agent, or Firm*—Ryan, Mason & Lewis, LLP

(57) ABSTRACT

A method for redirecting void diffusion away from vias in an integrated circuit design includes steps of forming an electrical conductor in a first electrically conductive layer of an integrated circuit design, forming a via between a distal end of the electrical conductor and a second electrically conductive layer of the integrated circuit design, and reducing tensile stress in the electrical conductor to divert void diffusion away from the via.

11 Claims, 8 Drawing Sheets

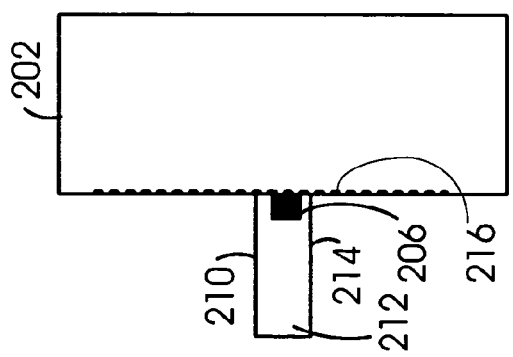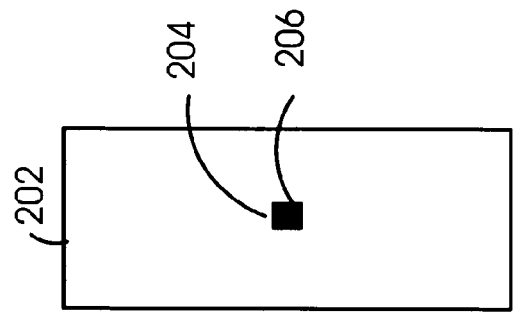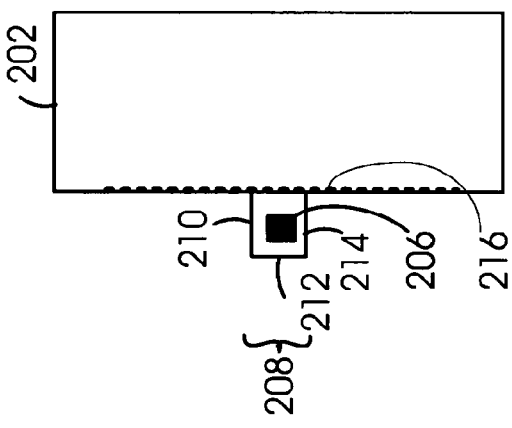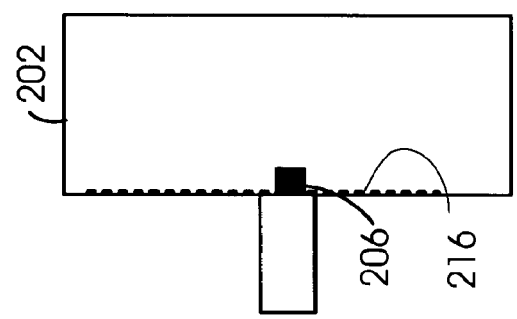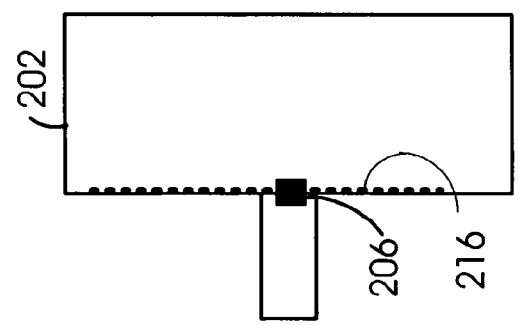

METHOD FOR REDIRECTING VOID DIFFUSION AWAY FROM VIAS IN AN INTEGRATED CIRCUIT DESIGN

CROSS-REFERENCE TO RELATED APPLICATIONS

This application is a divisional of prior application Ser. No. 11/323,400, filed on Dec. 29, 2005, titled "METHOD AND APPARATUS FOR REDIRECTING VOID DIFFUSION AWAY FROM VIAS IN AN INTEGRATED CIRCUIT DESIGN", by Allman et al., which issued as U.S. Pat. No. 7,361,965 on Apr. 22, 2008, the disclosure of which is incorporated herein by reference.

BACKGROUND OF THE INVENTION

1. Field of the Invention

The present invention is directed to the manufacture of integrated circuits. More specifically, but without limitation thereto, the present invention is directed to avoiding the formation of voids at vias in an integrated circuit.

2. Description of the Prior Art

Integrated circuit designs typically include electrical conductors such as metal contact pads formed in a top metal layer of the integrated circuit. Electrical connections between the electrical conductors in the top metal layer and lower level metal interconnect layers in the integrated circuit are generally made by forming vias between the electrical conductors in the top metal layer and electrical conductors in the lower level metal interconnect layers.

SUMMARY OF THE INVENTION

In one embodiment, a method of redirecting void diffusion away from vias in an integrated circuit design includes steps of:

(a) forming an electrical conductor in a first electrically conductive layer of an integrated circuit design;

(b) forming a via between a distal end of the electrical conductor and a second electrically conductive layer of the integrated circuit design; and (c) reducing tensile stress in the electrical conductor to divert void diffusion away from the via.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein:

FIGS. 2A, 2B, 2C, 2D, and 2E illustrate top views of via line extensions and via placements for the contact pad of FIG. 1;

Figure 1A:
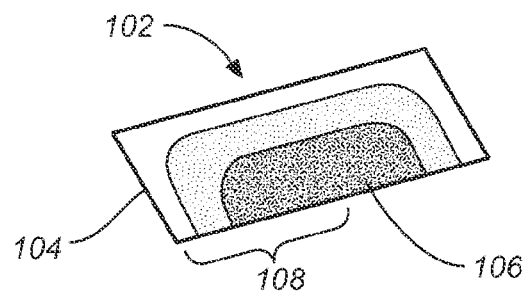
FIG. 1A illustrates a top view of the stress gradient in a typical contact pad of the prior art.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

Integrated circuit designs typically include metal contact pads formed in a top metal layer of the integrated circuit. The contact pads in the top metal layer are connected to interconnect metal layers inside the integrated circuit by vias formed between the top metal layer and the interconnect layers. In a currently used architecture, trenches and vias are formed in a dielectric material that is filled with a sandwich of metal layers. The first metal layers are used to create a barrier layer between the interconnect metal and the dielectric material to avoid an interaction that may cause the dielectric to fail.

Following the first metal layers, a thin copper layer is deposited to form a seed layer for the electro-deposition of an additional copper metal interconnect layer. After filling the trenches with the metal interconnect layer and annealing, excess material is removed by a chemical mechanical polishing process, so that interconnect metal remains only in the trenches and vias.

A dielectric capping layer is then deposited to seal the metal interconnect layer that also serves as a barrier material. The previous sequence of steps is repeated to form additional metal interconnect layers in the integrated circuit. The metal barrier layer at the bottom of each via is in direct contact with the next metal layer, avoiding diffusion of copper between the interconnect metal layers.

In recent Cu/low k interconnect technology, diffusion of copper atoms along tensile stress gradients of large contact pads, for example, having a width greater than 0.75 microns and a length greater than 0.75 microns, results in stress induced voids between the via and the contact pad. For metal lines less than 0.4 microns wide, the tensile stress results in voids inside the via. In either case, the voids break the electrical connection, resulting in circuit failure. Voids in metal interconnects and vias are believed to result from mass migration of metal toward a location of highest tensile stress, leaving voids in the areas of lowest tensile stress. The number of voids in a metal film is directly related to the density of the film or grain structure and distribution of grain sizes. The diffusion of voids, that is, the movement of metal to locations of high tensile stress, is driven by stress gradients in the metal film and by void concentration gradients. The resulting grain structure in a copper interconnect depends on the size of the interconnect. Larger copper interconnects have a larger grain structure in comparison to smaller copper interconnects. Also, the volume of the metal film has to be sufficient for forming a void that can cause a failure in an interconnect or a via.

Stress induced voiding has become a major reliability issue for Cu/low k interconnect technology. Due to the large variation in the properties of the materials used in circuit fabrication, for example, coefficient of thermal expansion and Young's modulus, a stress gradient is created across the integrated circuit that increases greatly in areas where large metal pads are present. Copper atoms diffuse through the vias and the contact pads along the stress gradient in a non-uniform manner, resulting in the formation of stress induced voids in the circuit.

One of the worst case geometrical features that frequently occurs in an integrated circuit design is when a small metal interconnect with a via at one end protrudes from a large block of metal, such as a clock tree, power line, or ground line. The voids in the large block diffuse to the end of the interconnect where the via is located, resulting in a failure of the via.

To counter the formation of stress induced voids, multiple vias may be added to provide extra sinks for voiding and reduce the probability of circuit failure. Disadvantageously, the geometrical criteria for adding vias are not readily implemented in software routing tools, and the loss of routing grids resulting from the added vias increases the difficulty of routing the integrated circuit design. Further, the addition of a second via increases the length of interconnects in the adjacent metal layers, typically by the width of the via plus the via spacing. The decrease in router efficiency results in increased circuit area and/or additional interconnect layers, increasing the turnaround time and cost of manufacturing the integrated circuit. Also, current integrated circuit design rules do not restrict the location of vias within the boundary of a large contact pad, increasing the probability that stress induced voiding and resulting circuit failure will occur.

FIG. 1A illustrates a top view of the stress gradient in a typical contact pad of the prior art. Shown in FIG. 1 are a contact pad 102, an edge 104, a center 106, and a stress gradient 108.

In FIG. 1A, the stress gradient 108 illustrated by the light to dark shading increases from the edge 104 to the center 106 of the contact pad 102 as described in Huang, IITC 2003. Because the stress gradient is highest at the center 106, the degree of diffusion that results in voiding is highly dependent on via placement relative to the center 106.

Figure 1B:
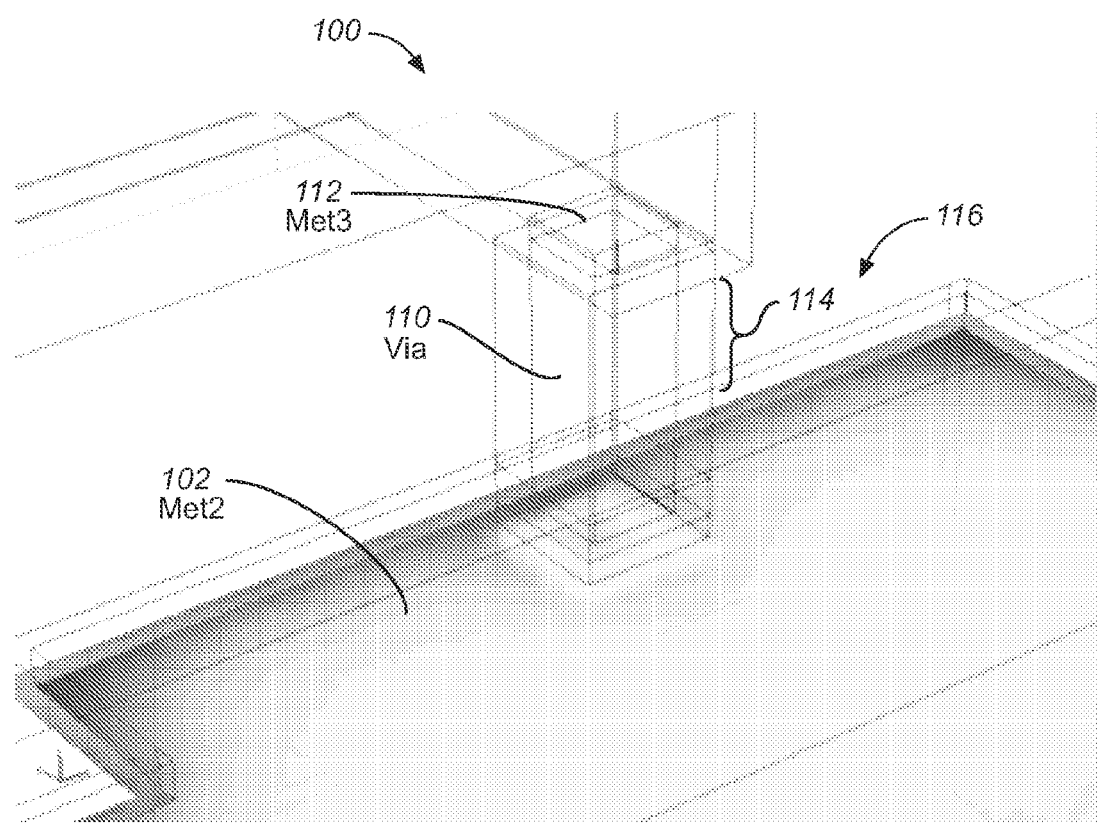
FIG. 1B illustrates a three-dimensional view of a lower metal level and a via of the prior art.

FIG. 1B illustrates a three-dimensional view 100 of a lower metal level and a via of the prior art. Shown in FIG. 1B are a lower metal level contact pad 102, a via 110, a top metal level line extension 112, a dielectric interface 114, and a dielectric layer 116.

In FIG. 1B, the highest compressive stress (low tensile stress) regions are nearest the edge of the lower metal level contact pad 102 and the dielectric interface 114, where the via 110 is in contact with the dielectric layer 116.

FIGS. 2A, 2B, 2C, 2D, and 2E illustrate top views of various via placements over the contact pad of FIG. 1A. Shown in FIGS. 2A, 2B, 2C, 2D, and 2E are a contact pad 202, a center 204, a via 206, a line extension 208, outside edges 210, 212, and 214, and a boundary 216.

In FIGS. 2A, 2B, 2C, 2D, and 2E, the via 206 is formed between the top metal layer in which the contact pad 202 is formed and an inner metal layer typically used to make electrical connections within the integrated circuit. Because the reduction in stress induced voiding resulting from placing the via 206 at the boundary 216 of the contact pad 202 where the lowest diffusion occurs is still not sufficient to meet stringent reliability standards, the line extension 208 is added to the contact pad 202 to further reduce induced stress at the via 206. The line extension 208 extends outside the boundary 216 of the contact pad 202.

In FIG. 2A, the via 206 is placed at the end of the line extension 208 near the outside edge 212. The distance between the outside of the via 206 and the outside edge 212 is the end overlap. The distance between the side of the via 206 facing the outside edge 210 and the outside edges 210 and 214 is the side overlap.

In FIG. 2B, the via 206 is placed just outside the boundary 216 of the contact pad 202 so that the edge of the via 206 facing the boundary 216 of the contact pad 202 coincides with the boundary 216.

In FIG. 2C, the via 206 is placed in the line extension 208 so that a portion of the via lies inside the boundary 216 of the contact pad 202.

In FIG. 2D, the via 206 is placed just inside the contact pad 202 so that the edge of the via 206 facing the boundary 216 of the contact pad 202 coincides with the boundary 216 at the end of the line extension 208.

In FIG. 2E, the via 206 is placed at the center 204 of the contact pad 202.

Figure 3:
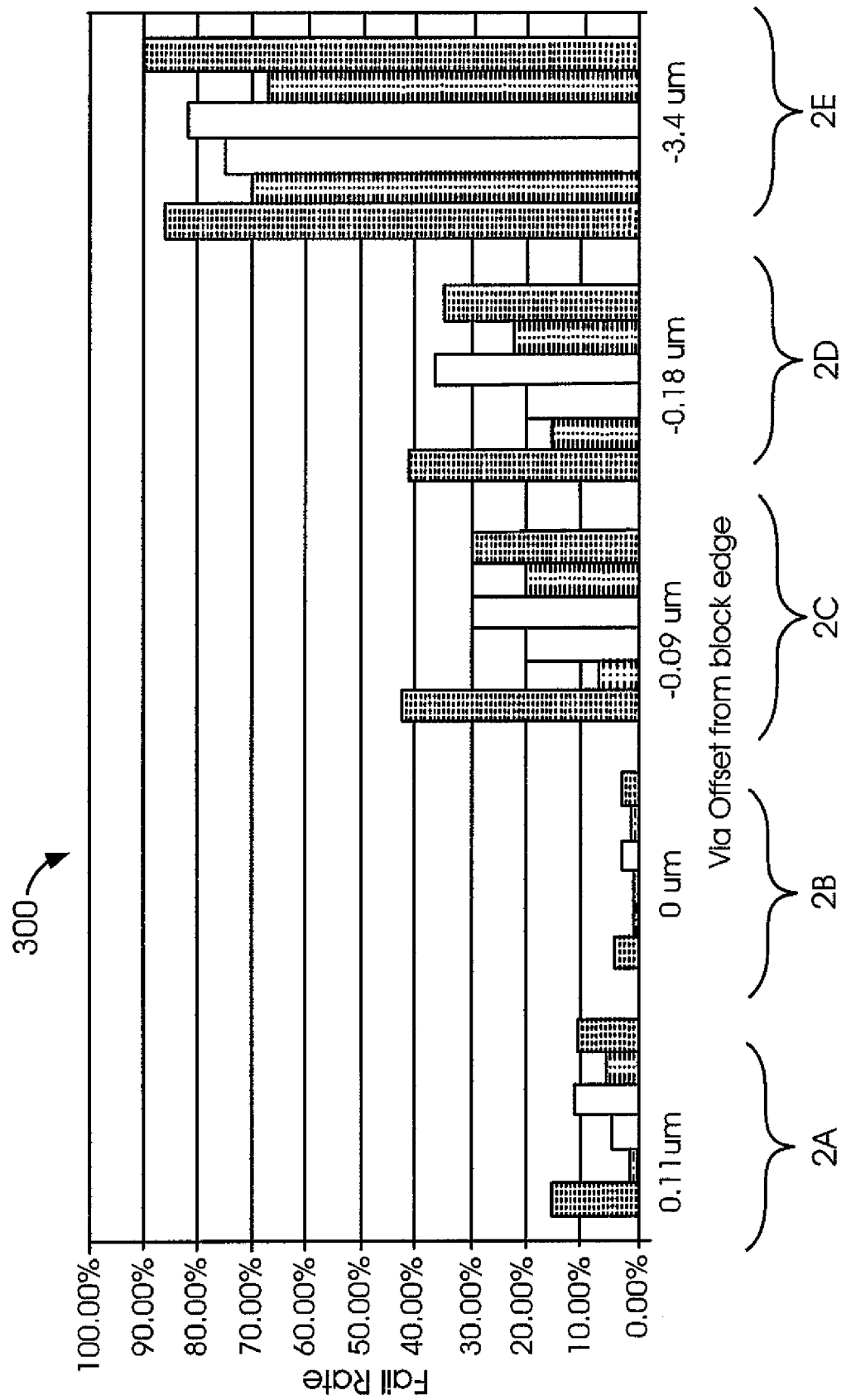
FIG. 3 illustrates a bar graph of void failure rates for each of the via placements in the via line extensions of FIG. 2.

FIG. 3 illustrates a bar graph 300 of the relative circuit failure rate for each of the via placements of FIG. 2. The set of six bars for each plot represents different sample lots. As may be appreciated from FIG. 3, the arrangements of FIGS. 2A and 2B result in the lowest failure rate, while the center placement of FIG. 2E results in the highest failure rate.

The lifetime of a via in an integrated circuit and the corresponding product reliability may be advantageously increased by adding an electrically conductive area to the integrated circuit design as follows.

In one embodiment, an apparatus for redirecting void diffusion away from vias in an integrated circuit design includes:
  an electrical conductor formed in a first electrically conductive layer of an integrated circuit design;
  a via formed between a distal end of the electrical conductor and a second electrically conductive layer of the integrated circuit design; and
  at least one of an electrically conductive area added to the electrical conductor and a portion of a dielectric layer removed adjacent to the electrical conductor to divert void diffusion away from the via.

Figure 4:
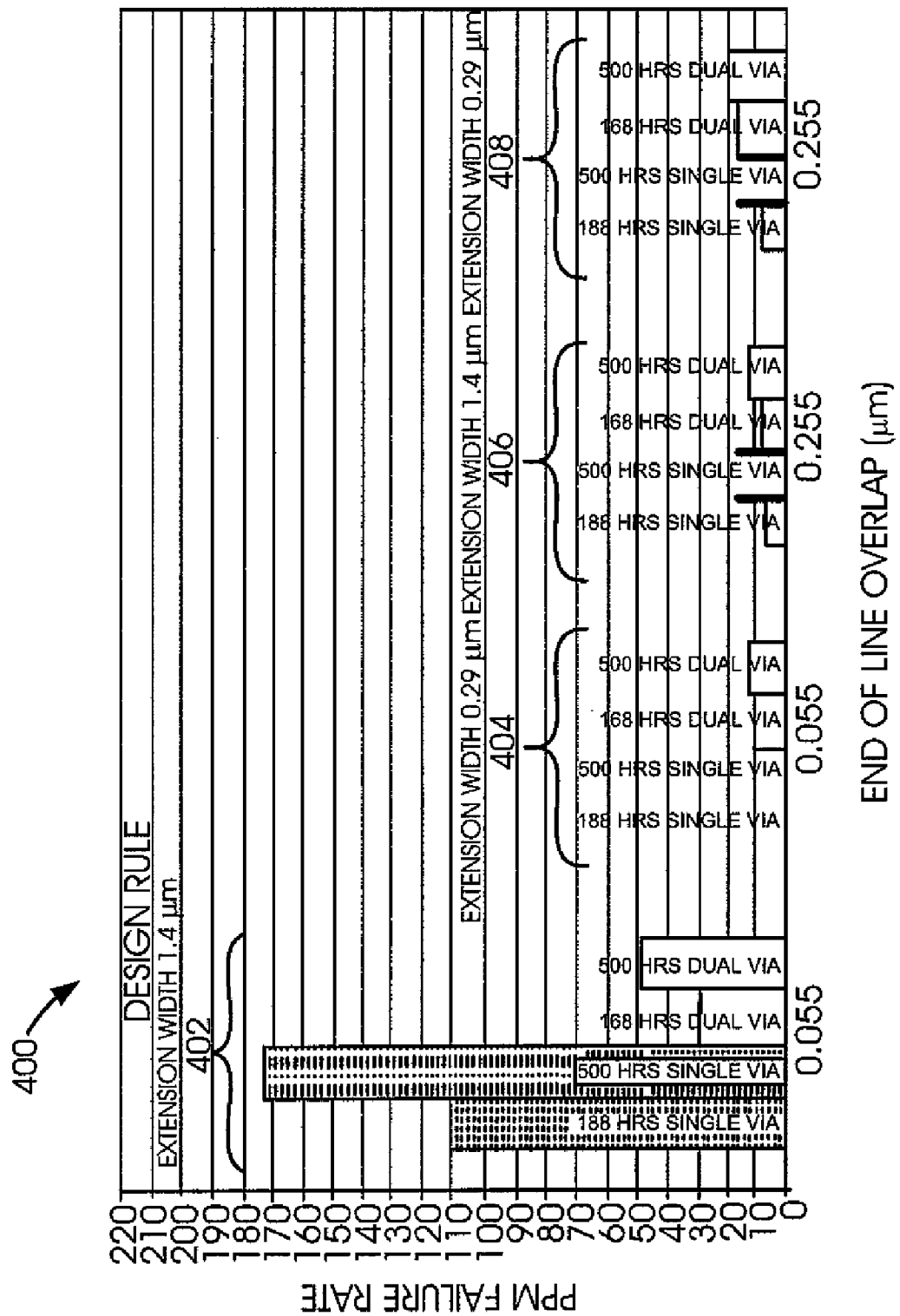
FIG. 4 illustrates a bar graph of void-induced failure rates for two widths of the electrical conductor and two areas of end overlap of the electrical conductor over the via.

FIG. 4 illustrates a bar graph 400 of void-induced failure rates for two widths of the electrical conductor and two areas of end overlap of the electrical conductor over the via. Shown in FIG. 4 are bar sets 402, 404, 406 and 408.

In FIG. 4, each of the bar groups 402, 404, 406 and 408 includes four bars representative of failure rates at 168 hours for a single via, 500 hours for a single via, 168 hours for a dual via, and 500 hours for a dual via, respectively. In the example of FIG. 4, the electrical conductor is the line extension in FIG. 2A. The bar set 402 illustrates the failure rate for a line extension having a width of 1.4 microns and an end overlap extending over the via by 0.055 microns. The bar set 404 illustrates the failure rate for a line extension having a width of 0.29 microns and an end overlap extending over the via by 0.055 microns. The bar set 406 illustrates the failure rate for a line extension having a width of 1.4 microns and an end overlap extending over the via by 0.255 microns. The bar set 408 illustrates the failure rate for a line extension having a width of 0.029 microns and an end overlap extending over the via by 0.255 microns. As may be appreciated from FIG. 4, the failure rate is significantly lower for the larger metal line width that has a longer extension beyond the end of the via. Smaller line widths benefit to a lesser degree from a longer line extension. An extension of 0.1 microns or more has a minimal impact on the routing of an integrated circuit design, while collecting the voids at the end of the line extension away from the via. On one embodiment, the length of the line extension beyond the end of a via may be employed in a single metal level, while in other embodiments, the length of the line extension beyond the end of a via may be employed in multiple metal levels. The length of the line extension beyond the end of a via may be calculated from the area of the block connected to the line extension, the width of the line extension, and the distance of the via from the block by the following equation using spreadsheet software operators:

End of Line Extension $(EOL)=IF(0.055$ microns$+W1\cdot$(Area of block)$+W2\cdot$(Line width)$-W3\cdot$(Via distance from block))$<0.055$ microns), $0.055$ microns, $IF(0.055$ microns$+(W1\cdot$(Area of block)$+W2\cdot$(Line width)$-W3\cdot$(Via distance from block))$>0.255$ microns), $0.255$ microns, $0.055$ microns$+W1$(Area of block)$+W2\cdot$(Line width)$-W3\cdot$(Via distance from block)     (1)

In equation (1), W1, W2 and W3 are empirically derived weighting factors for the geometrical combination of a large block with a signal line extension. Using the same methodology, other terms may be added or subtracted from equation (1) to represent other geometrical combinations. By way of example, the weighting factors may be set as follows for units given in microns: $W1=0.001$ (microns$^{-1}$), $W2=0.069$, and $W3=0.103$.

Figure 5A:
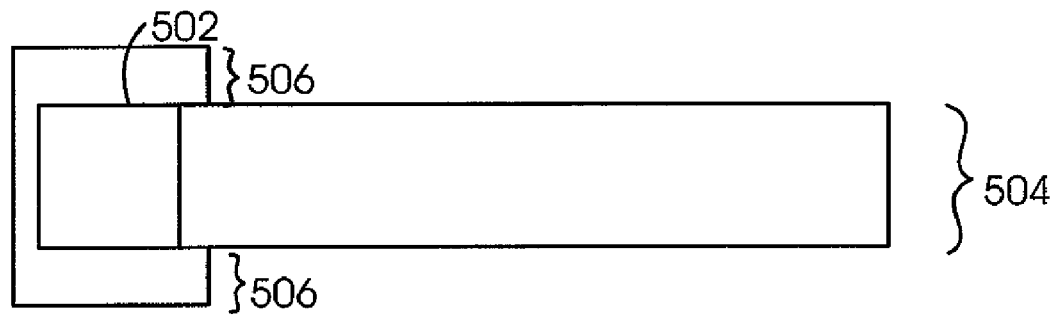
FIGS. 5A, 5B, 5C and 5D illustrate top views of additions to the electrically conductive area of the integrated circuit design to divert void diffusion away from a via.
Figure 5B:
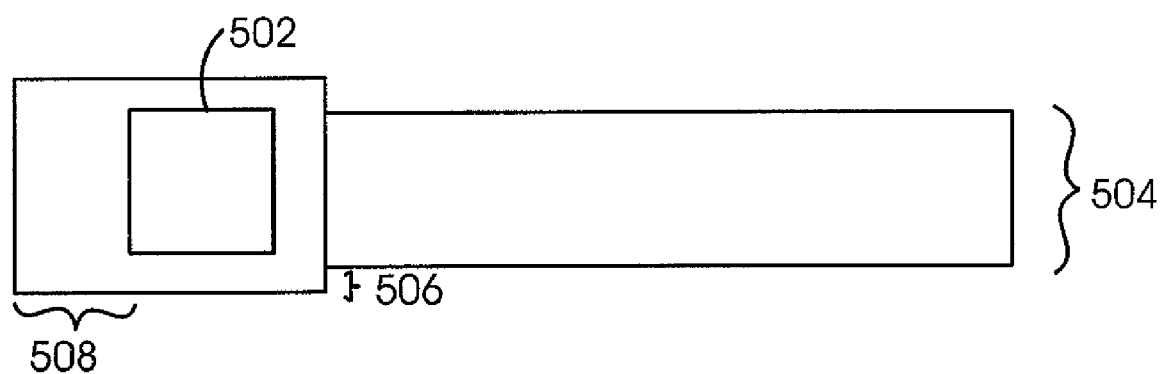
Figure 5C:
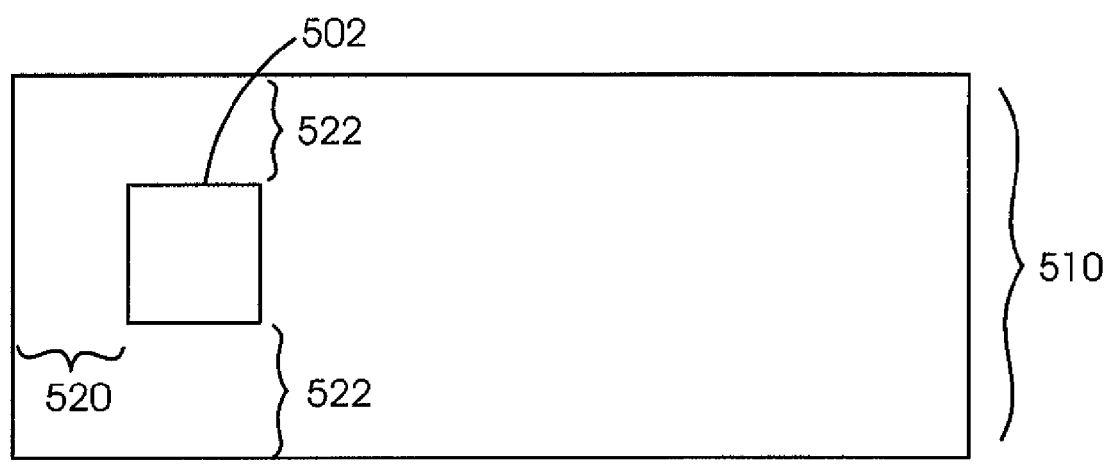
Figure 5D:
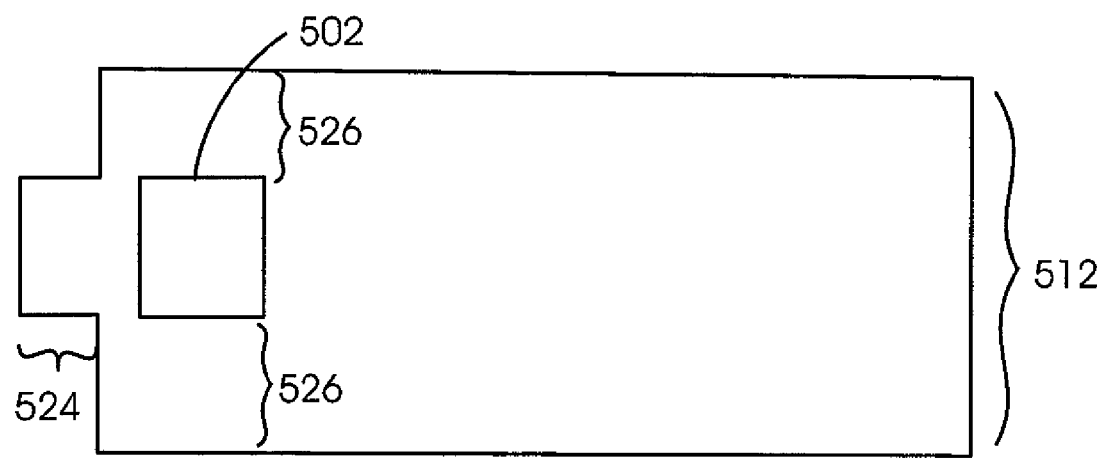

FIGS. 5A, 5B, 5C and 5D illustrate top views of additions to the electrically conductive area of the integrated circuit design to divert void diffusion away from a via. Shown in FIG. 5A are a via 502, a line extension 504, and a side overlap 506. Shown in FIG. 5B are a via 502, a line extension 504, a side overlap 506, and an end overlap 508. Shown in FIG. 5C are a via 502, a line extension 510, an end overlap 520, and a side overlap 522. Shown in FIG. 5D are a via 502, a line extension 512, an end overlap 524, and a side overlap 526.

In FIG. 5A, the side overlap 506 is added to the line extension 504 to overlap the sides of the via 502, for example, by about 0.001 microns.

In FIG. 5B, the side overlap 506 is added to the line extension 504 to overlap the sides of the via 502, for example, by about 0.001 microns, and the end overlap 508 is added to the line extension 504, for example, about 0.055 microns from the edge of the via 502.

In FIG. 5C, the entire line extension 510 is widened and lengthened to form the end overlap 520 and the side overlap 522 over the via 502.

In FIG. 5D, the entire line extension 512 is widened and lengthened to form the side overlap 526 over the via 502; however, the side overlap 526 is removed from the end overlap 524.

Figure 5E:
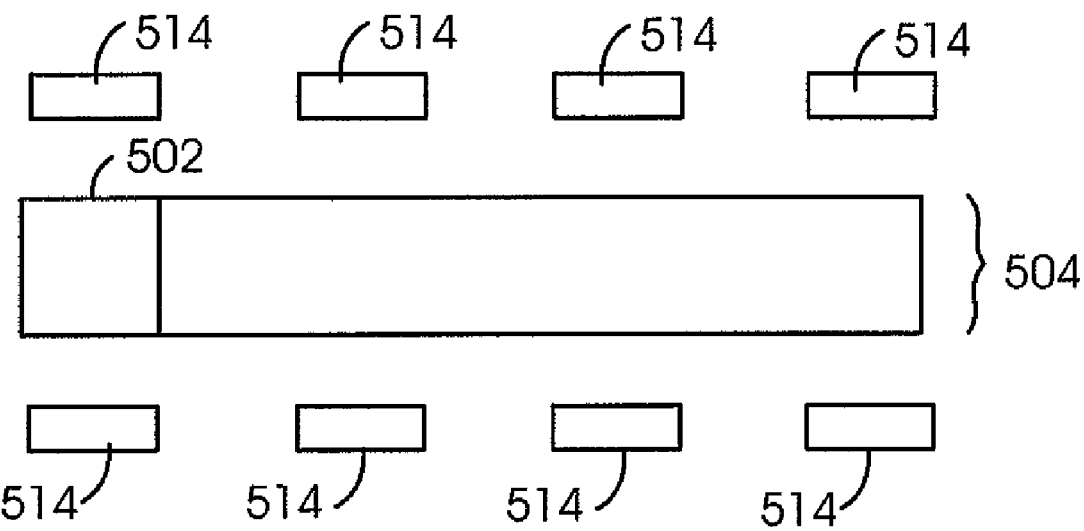
FIGS. 5E and 5F illustrate side views of removal of material from a dielectric layer to divert void diffusion away from a via.
Figure 5F:
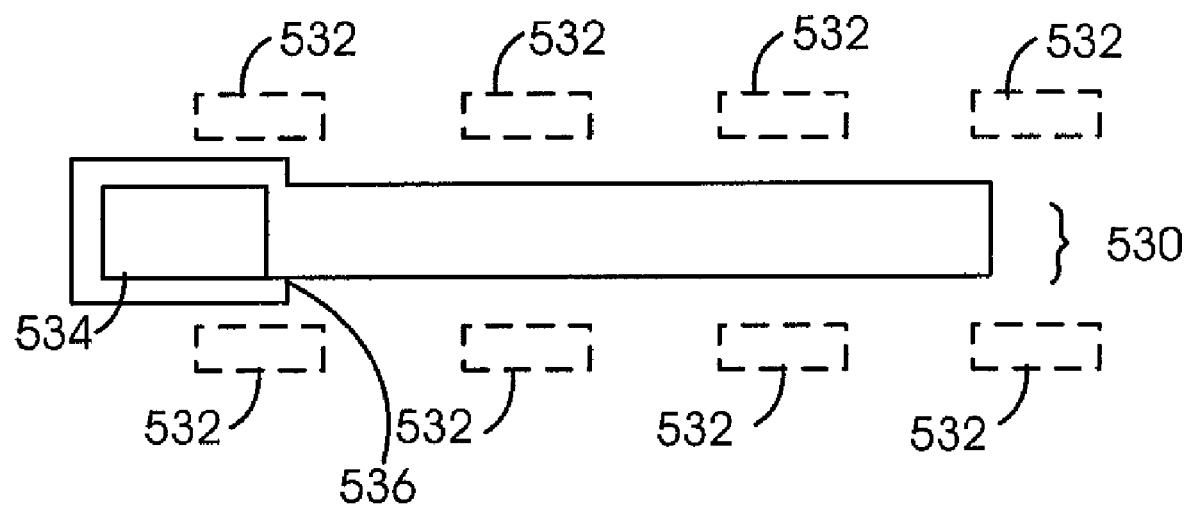

FIGS. 5E and 5F illustrate side views of removal of material from a dielectric layer to divert void diffusion away from a via. Shown in FIG. 5E are a via 502, a line extension 504, and removed portions 514 in adjacent dielectric layers above and below the metal line interconnect layer. Shown in FIG. 5F are a line extension 530, removed portions 532 in adjacent dielectric layers above and below the metal line extension 530, a via 534, and a side overlap 536.

In FIG. 5E, the portions 514 may be removed from the dielectric layers adjacent to the line extension 504 to reduce the stress gradient in the line extension 504. In one embodiment, portions 514 of the adjacent dielectric layers are removed from around the via 502 and the metal line extension 504. In other embodiments, the portions 514 removed from the dielectric layers may extend above and below the line extension 504.

In FIG. 5F, the area of the via 534 is enlarged, for example, in a direction parallel to the line extension 530 to enhance the reduction of the stress gradient in the line extension 530 provided by the side overlap 536. Also, the portions 532 in the adjacent dielectric layers above or below the line extension 530 may be removed to further reduce the stress gradient in the line extension 530.

Each of the methods of reducing tensile stress illustrated in FIGS. 5A, 5B, 5C, 5D, 5E and 5F may be combined with one another according to well-known techniques to practice further embodiments within the scope of the appended claims.

In another embodiment, a method of redirecting void diffusion away from vias in an integrated circuit design includes steps of:
(a) forming an electrical conductor in a first electrically conductive layer of an integrated circuit design;
(b) forming a via between a distal end of the electrical conductor and a second electrically conductive layer of the integrated circuit design; and
(c) reducing tensile stress in the electrical conductor to divert void diffusion away from the via.

Figure 6:
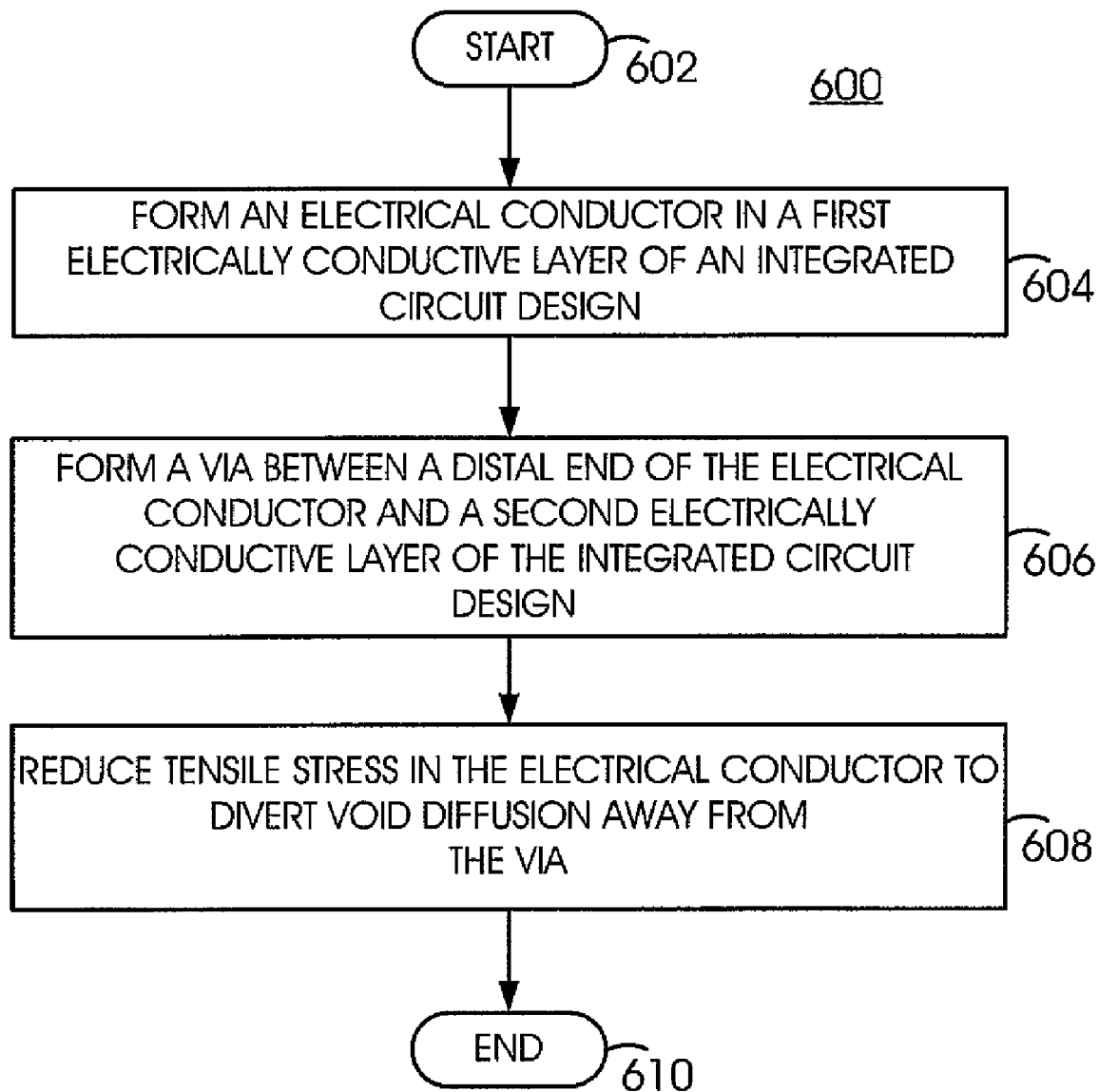
FIG. 6 illustrates a flow chart for a method of divert void diffusion away from a via in an integrated circuit design.

FIG. 6 illustrates a flow chart 600 for a method of diverting void diffusion away from a via in an integrated circuit design.

Step 602 is the entry point of the flow chart 600.

In step 604, an electrical conductor is formed in a first electrically conductive layer of an integrated circuit design. The electrical conductor may be, for example, a signal line or a line extension from a block such as a contact pad in an integrated circuit design.

In step 606, a via is formed between a distal end of the electrical conductor and a second electrically conductive layer of the integrated circuit design. The distal end denotes the end of the electrical conductor furthest from the signal source or sink.

In step 608, tensile stress is reduced in the electrical conductor by adding an electrically conductive area to the electrical conductor or by removing dielectric material adjacent to the electrical conductor to divert void diffusion away from the via. Various examples of how the electrically conductive area may be added and how dielectric material may be removed are illustrated above in FIGS. 5A, 5B, 5C, 5D, 5E and 5F.

Step 610 is the exit point of the flow chart 600.

Although the flowchart description above is described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The flow chart described above with reference to FIG. 6 may also be automated by instructions for a computer. The instructions may be embodied in a disk, a CD-ROM, and other computer readable media according to well known computer programming techniques, for example, in automated placement and routing tools for integrated circuits, advantageously reducing circuit failures resulting from diffusion of voids to vias.

The specific embodiments and applications thereof described above are for illustrative purposes only and do not preclude modifications and variations that may be made within the scope of the following claims.

What is claimed is:

1. A method for redirecting void diffusion away from vias in an integrated circuit design, the method comprising steps of:
   (a) forming an electrical conductor in a first electrically conductive layer of an integrated circuit design;
   (b) forming a via between a distal end of the electrical conductor and a second electrically conductive layer of the integrated circuit design; and
   (c) reducing tensile stress in the electrical conductor to divert void diffusion away from the via.

2. The method of claim 1 wherein step (c) comprises increasing an area of the via.

3. The method of claim 1 wherein step (c) comprises adding an electrically conductive area to the electrical conductor.

4. The method of claim 1 wherein step (c) comprises extending the electrical conductor a distance away from the via in at least one of the first electrically conductive layer and the second electrically conductive layer of the integrated circuit design.

5. The method of claim 4 wherein the electrical conductor is extended by a length calculated from a function of an area of a block connected to a proximal end of the electrical conductor, a width of the electrical conductor, and a distance between the via and the block in the integrated circuit design.

6. The method of claim 1 wherein step (c) comprises forming at least one of an end overlap and a side overlap of the electrical conductor over the via.

7. The method of claim 6 wherein the end overlap extends about 0.055 microns from the via.

8. The method of claim 6 wherein the side overlap extends about 0.001 microns from the via.

9. The method of claim 5 wherein the area of at least one of the end overlap and the side overlap is determined from a layout of the first electrically conductive layer and the second electrically conductive layer of the integrated circuit design.

10. The method of claim 1 further comprising placing the via at a proximal end of the electrical conductor adjacent to a block connected to the electrical conductor.

11. The method of claim 1 wherein step (c) comprises removing a portion of a dielectric layer adjacent to the electrical conductor.

* * * * *